(12) United States Patent
Hall

(10) Patent No.: US 6,362,067 B1
(45) Date of Patent: Mar. 26, 2002

(54) ACCURATE SELF-ALIGNED RESISTOR STRUCTURE AND METHOD OF MAKING THE SAME

(75) Inventor: Jefferson W. Hall, Phoenix, AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/783,522

(22) Filed: Feb. 15, 2001

(51) Int. Cl.$^7$ ............................................... H01L 27/02
(52) U.S. Cl. ........................................ 438/382; 438/383
(58) Field of Search .................... 438/238, 382–385

(56) References Cited

U.S. PATENT DOCUMENTS

| | | | | |
|---|---|---|---|---|
| 4,263,518 A | * | 4/1981 | Ballatore et al. | 307/303 |
| 4,830,976 A | * | 5/1989 | Morris et al. | |
| 6,060,918 A | * | 5/2000 | Tsuchida et al. | 327/143 |
| 6,072,220 A | * | 6/2000 | Stack | 257/379 |

OTHER PUBLICATIONS

NN83014171, Narrow base epitaxial base lateral PNP, IBM technical disclosure bulletin, 1/83, US.*

Wolf, pp. 387–388, vol. 2, silicon processing for VLSI ERA, Lattice press, 1990.*

* cited by examiner

*Primary Examiner*—Jey Tsai

(57) ABSTRACT

A metal oxide semiconductor (MOS) device (100) includes a plurality of resistive elements (108) positioned within, and surrounded by, a single active region (106). The resistive elements (108) are each formed within the single active region (106) using conductive film strips (110) as self-aligned masks, thus "bird's beak" is avoided and the accuracy of the resistive elements (108) is improved. The conductive film (110) is formed within the active region (106) directly over a thin gate oxide film (204), rather than a thick field oxide, thus essentially eliminating parasitic leakage between the resistive elements (108), and reducing the substrate area consumed by the device (100).

16 Claims, 3 Drawing Sheets

ACCURATE SELF-ALIGNED RESISTOR STRUCTURE AND METHOD OF MAKING THE SAME

BACKGROUND OF THE INVENTION

The present invention relates in general to resistors formed in metal oxide semiconductor (MOS) integrated circuit (IC) processes and, more particularly, to self-aligned resistors that are highly matched, compact, and exhibit reduced parasitic leakage, and to methods of making these resistors.

Many IC applications require the use of matched resistors. In such instances, it is important that the resistors formed into the IC are accurate and use as little substrate area as possible.

Presently, individual matched resistors in metal oxide semiconductor (MOS) processes are formed into a well region within a substrate using an active area mask and a dopant mask. More particularly, a plurality of active areas are delineated on the surface of the well region by growing a plurality of thick field oxide regions. A gate oxide film is placed over the active areas and the thick field oxide regions in order to form the gate insulator of MOS transistors. Strips of polysilicon can be placed over the portions of the gate oxide film that covers the thick field oxide regions, and biased with a voltage to help prevent leakage. Then, dopant material is implanted into the active areas of the well region, through individual windows formed in the dopant mask, to form the individual resistor bodies.

The resistors formed using the above-described process suffer several disadvantages. First, the resistors suffer width variations due to the so-called "bird's beak" at the edges of the active areas. "Bird's beak" is a nonlinear oxide thinning caused by the various MOS fabrication steps. As a result of these width variations, the absolute and relative accuracy of the resistors is reduced. A second disadvantage is that parasitic leakage reduction between the resistor bodies is less than optimum. Although a voltage potential is applied to the polysilicon strips to inhibit such parasitic leakage, the polysilicon strips are each positioned above the thick field oxide regions thus providing limited parasitic leakage reduction effect. A third disadvantage is that the substrate area consumed by the resistors and associated well structure is less than optimum. This is because the total area consumed by the resistors is dependent on design rule spacing requirements, as defined by process capability. Specifically, the width dimension consumed by a single resistor includes the active area width (i.e., width of the resistor), a dopant mask overlap width on each side of the active area, and the spacing between the next resistor. The dopant mask overlap width dimension is necessary to take into account the manufacturing tolerances of the equipment being used to align the dopant and active area masks.

Hence, there is a need for a matched self-aligned resistor structure that does not suffer the accuracy reducing effects due to "bird's beak," that optimally reduces parasitic leakage between resistor bodies, and that consumes less substrate area.

DETAILED DESCRIPTION OF THE DRAWINGS

Figure 1:
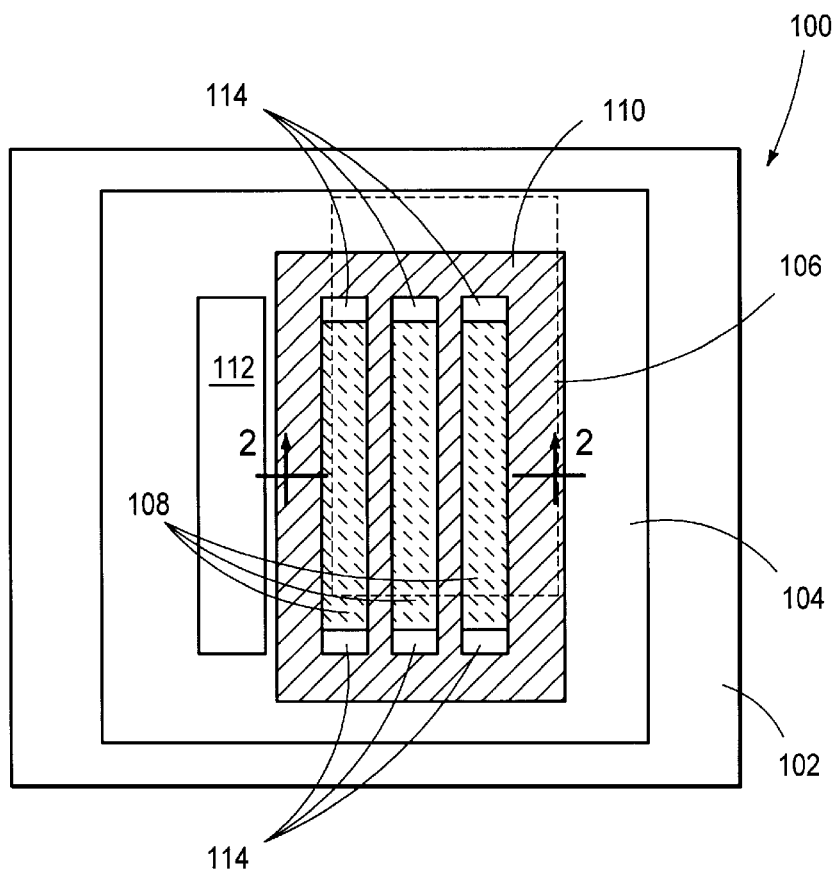
FIG. 1 depicts a schematic top view of a portion of a substrate including a plurality of matched self-aligned resistors manufactured as described herein.

As depicted in the top schematic view of FIG. 1, an embodiment of a device 100 with matched self-aligned resistors includes a substrate 102, a well region 104, an active region 106 (e.g., that portion within the dotted line), a plurality of resistive elements 108, a conductive film 110, and a well contact region 112. The plurality of resistive elements 108 is positioned within the active region 106, and each includes a resistive element contact region 114 at each end. The conductive film 110, comprising a material such as polysilicon, surrounds the plurality of resistive elements 108 and the concomitant resistive element contact regions 114, and includes strips interposed between each resistive element 108. The well contact region 112 is positioned within the well region 104 proximate the active region 106. Though not depicted, the well contact region 112 includes another active region therein to provide an electrical contact to the well contact region 112. The reason for providing such an electrical contact will be discussed further below.

Figure 2:
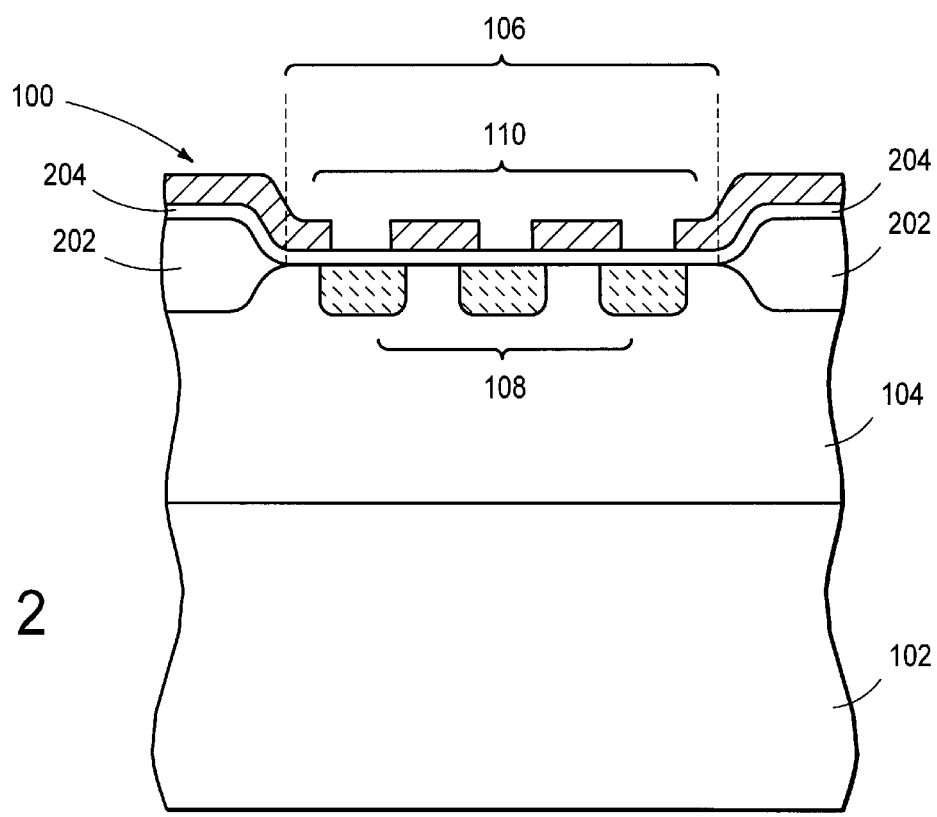
FIG. 2 is a cross section view of a portion of a substrate taken along line 2—2 of FIG. 1.

Turning to FIG. 2, a more detailed description of the spatial relationship of various portions of the device 100, when viewed in cross section along line 2—2 of FIG. 1, will now be provided. The silicon substrate 102 is doped with a material of a first conductivity type (e.g., either an n-type or p-type material). The well region 104, doped with a material of a second conductivity type (e.g., opposite that of the substrate 102), is formed within the substrate 102. Returning momentarily to FIG. 1, the well contact region 112 is relatively heavily doped with the same conductivity type material as the well region 104 (e.g., $p^+$ or $n^+$). Thus, using semiconductor industry terminology, the well contact region 112 is either an NSD or a PSD region, depending on the dopant's conductivity type. For example, if the well region 104 is doped with n-type material, then the well contact region 112 is an NSD region, and vice-versa.

Returning now to FIG. 2, the active region 106, as depicted more clearly therein, is formed by surrounding at least a portion of the well region 104 with a thick field oxide 202. The plurality of resistive elements 108 is formed in the well region 104, within the active region 106. Each resistive element 108 is relatively lightly doped with a material of the first conductivity type (e.g., $p^-$ or $n^-$), with the precise dopant concentration being dependent on the desired resistance to be achieved. Thus, again using semiconductor industry terms of art, the resistive elements 108 are either PHV or NHV regions, depending on the conductivity type of the dopant. Moreover, and with reference being returned once more momentarily to FIG. 1, the resistive element contact regions 114 are each relatively heavily doped with a material of the first conductivity type. Thus, each resistive element contact region 114 is either a PSD or NSD region, depending on the conductivity type of the dopant, which will be consistent with that used for the resistive elements 108. In other words, if p-type dopant is used to make PHV resistive elements 108, then p-type dopant is used to make PSD resistive element contact regions 114.

Returning once again to FIG. 2, a thin gate oxide layer 204 overlays the thick field oxide 202 and the surface of the well region 104 and the resistive elements 108 within the active region 106. The conductive film 110, including both the portion surrounding the active region 106 and the interposed strips, overlays the gate oxide layer 204.

The structure depicted in FIGS. 1 and 2, not surprisingly, results in the formation of a plurality of p-n junctions. For example, the well region 104 and the substrate 102 form a p-n junction, and the well region 104 and each of the resistive elements 108 form a plurality of p-n junctions. Thus, diode action and/or bipolar transistor action can occur during operation of the device 100 if proper biasing voltages are not applied. To prevent this, the well region 104, via the electrical contact to the well contact region 112 alluded to previously, is coupled to the highest magnitude voltage potential to which any of the resistive elements 108 is coupled, thus reverse biasing all of these p-n junctions.

In addition to diode and bipolar transistor action, MOS transistor action can occur if a sufficient amount of charge develops on the gate oxide layer 204. The undesired current flow between the resistive elements 108, due to this transistor action, is prevented by coupling the conductive film 110 to the same voltage potential as the well region 104. Because the polysilicon film 110 is separated from the well region 104 by the thin gate oxide layer 204, rather than a thick field oxide, parasitic leakage is dramatically reduced by applying the appropriate voltage to the conductive film 110.

Figure 3A:
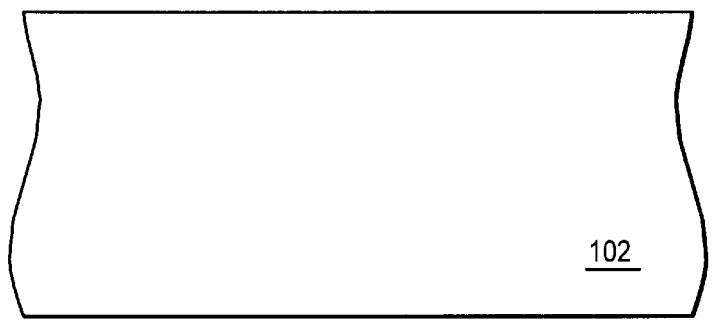
FIGS. 3A through 3E are cross sectional views depicting various steps in the manufacture of the matched MOS resistors as depicted in FIG. 2.
Figure 3B:
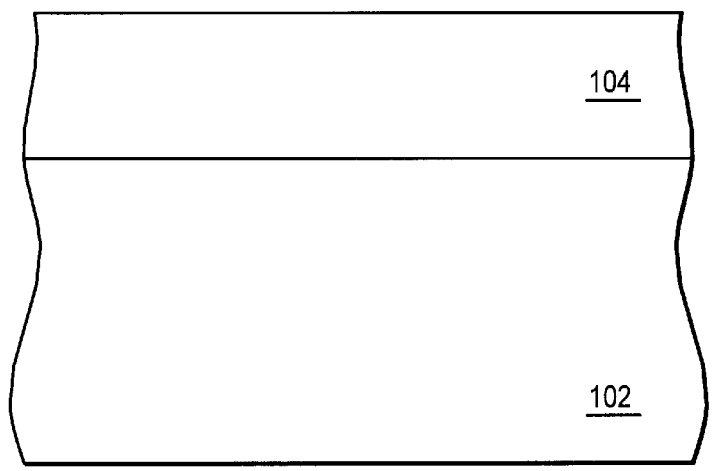
Figure 3C:
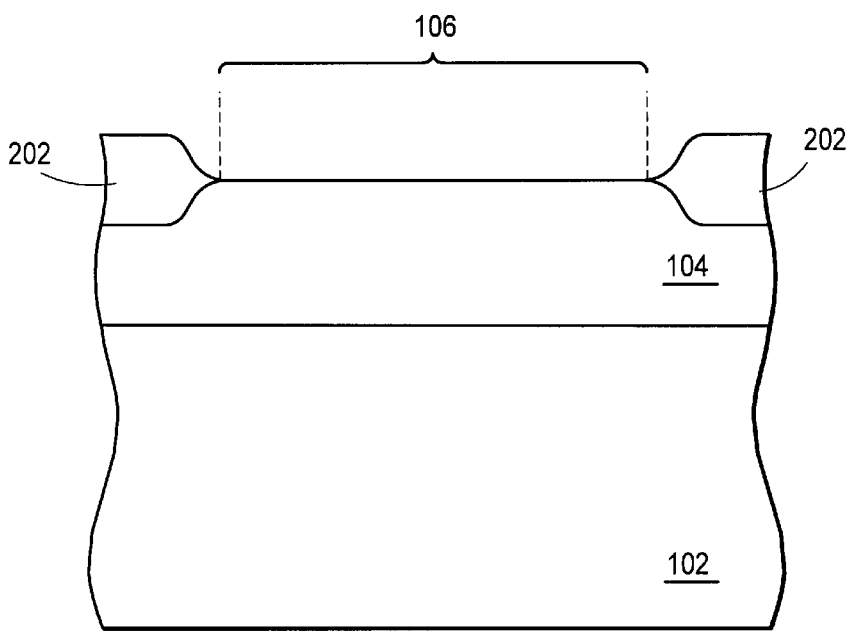
Figure 3D:
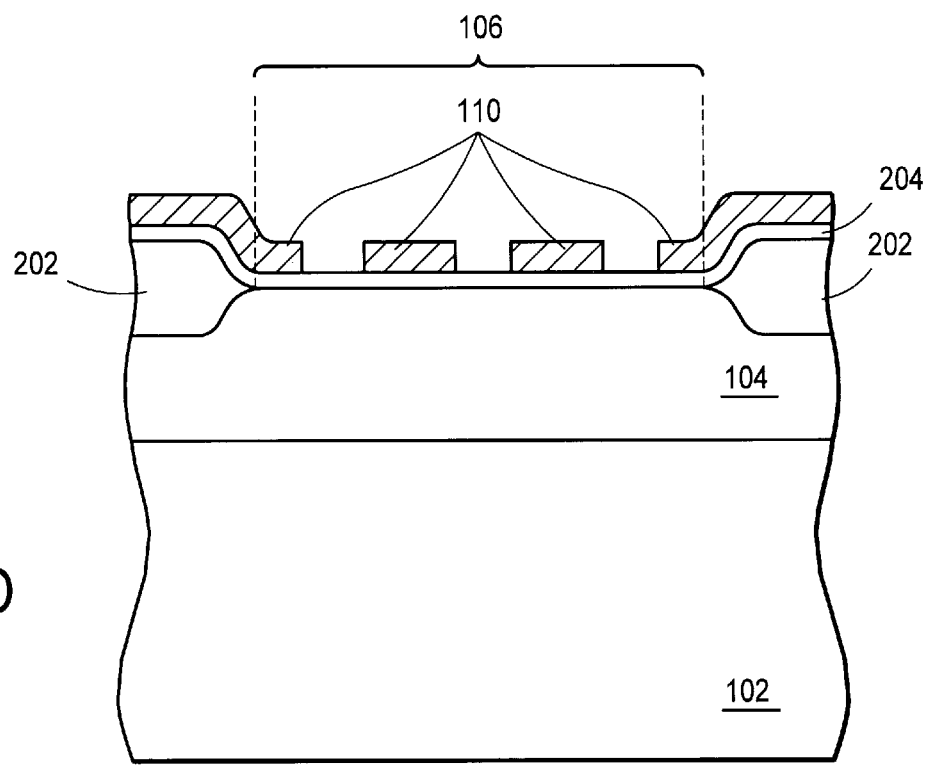
Figure 3E:
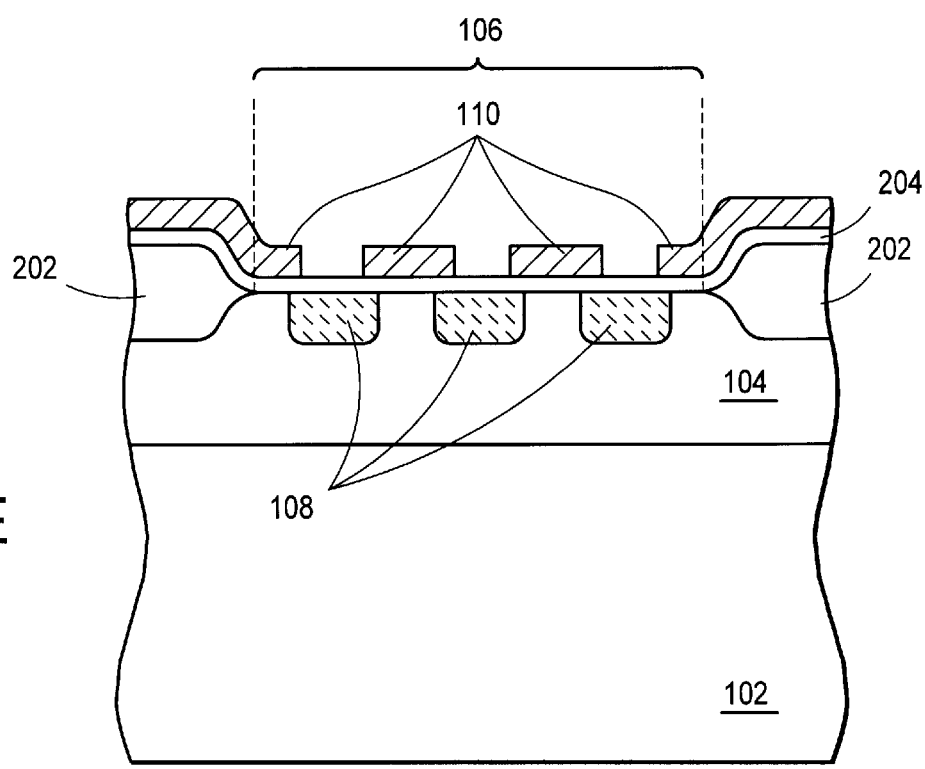

With reference now to FIGS. 3A through 3E, the basic methodological steps for making that portion of the device 100 illustrated in FIG. 2 will be described. First, the substrate 102 doped with a material of the first conductivity type is provided (FIG. 3A). Then, the well region 104 is formed by implanting dopant of the second conductivity type, via an appropriate masking process, and driving the implanted dopant material into the substrate 102 (FIG. 3B). After the well region 104 is formed, the active region 106 is formed by growing the thick field oxide 202, using an appropriate masking process, on the substrate 102 to surround at least a portion of the well region 104 (FIG. 3C). Once the active region 106 is formed, the gate oxide layer 204 is then grown followed by the deposition and etching, using an appropriate masking process, of the conductive film 110 (FIG. 3D). Finally, the resistive elements 108 are formed by implanting dopant of the first conductivity type, using the etched conductive film 110 as self-aligning masks, and driving the implanted dopant materials into the well region 104 (FIG. 3E). Though not depicted in FIGS. 3A through 3E, the well contact region 112 and resistive element contact regions 114 (and appropriate contacts and conductors) are also formed into the device 100.

In summary, the device 100 includes a single active region 106 surrounding the plurality of resistive elements 108, rather than a plurality of active regions into which individual resistive elements are formed. The resistive elements 108 are each formed within the single active region 106 using the interposed conductive film 110 strips as self-aligned masks, thus "bird's beak" is avoided and the accuracy of the resistive elements 108 is improved. Additionally, within the active region 106 the conductive film 110 is formed directly over the thin gate oxide layer 204, rather than a thick field oxide. As a result, parasitic leakage between the resistive elements 108 is essentially eliminated with applied bias voltage. Moreover, the only design rule spacing requirements, so to speak, for the active region 106 are those associated with the width of the interposed conductive strips 110 and the width of the openings in the conductive film 110 that define the edges of the resistive elements 108. Because the deposition and etching process for a conductive film, such as polysilicon, allows greater tolerance accuracies than with active area and dopant masking and etching processes, the substrate area consumed by the device 100 is significantly reduced. Specifically, substrate area consumption is reduced by about 30 percent.

Although a device 100 including only three resistive elements 108 is described and depicted herein, other numbers of resistive elements 108 can be embodied in the present device 100.

What is claimed is:

1. A method of making a semiconductor device, comprising:

forming a well region having a first dopant concentration of a first conductivity type in a substrate;

forming a conductive film over the well region for receiving a bias voltage; and implanting resistive elements patterned by openings in the conductive film, where the bias voltage reduces a leakage current between resistive elements.

2. The method of claim 1, further comprising forming an active region within the well region prior to implanting the resistive elements.

3. The method of claim 2, wherein the active region is formed by surrounding the well region with a field oxide.

4. The method of claim 1, further comprising forming a gate oxide layer at least between the conductive film and the well region.

5. The method of claim 1, further comprising implanting resistive element contact regions within the resistive elements.

6. The method of claim 1, further comprising forming a well contact-region in the well region.

7. The method of claim 1, wherein the well region is formed in a semiconductor substrate.

8. A method of forming a plurality of self-aligned resistive elements in a semiconductor substrate, comprising:

forming a well region having a first dopant concentration of first conductivity type in the semiconductor substrate;

forming an active area within the well region;

forming a conductive film over the active area for coupling to a bias voltage to reduce a leakage current between resistive elements; and implanting the resistive elements having a second dopant concentration of a second conductivity type into the well region through openings in the conductive film.

9. The method of claim 8, further comprising forming a gate oxide layer between at least the portion of the surface of the well region and the conductive film.

10. The method of claim 8, wherein the step of forming a single active area comprises surrounding at least a portion of the well region with a thick field oxide.

11. The method of claim 8, further comprising implanting resistive element contact regions having a third dopant concentration of the second conductivity type within the resistive elements.

12. A method of making resistors, comprising the steps of:

forming a conductive film over a semiconductor substrate;

introducing dopants into the semiconductor substrate that are masked by openings in the conductive film to form the resistors; and biasing the conductive film to a voltage to reduce a leakage current between the resistors.

13. The method of claim 12, wherein the step of forming a conductive film includes the step of forming the conductive film over a well region in the semiconductor substrate.

14. The method of claim 13, further comprising the step of forming a gate oxide between the conductive film and a surface of the well region.

15. The method of claim 13, further comprising the step of surrounding the well region with a field oxide.

16. The method of claim 12, wherein the step of introducing includes the step of implanting the resistors through the openings.

* * * * *